(12) United States Patent
Plat et al.

(10) Patent No.: US 7,659,166 B2
(45) Date of Patent: Feb. 9, 2010

(54) INTEGRATION APPROACH TO FORM THE CORE FLOATING GATE FOR FLASH MEMORY USING AN AMORPHOUS CARBON HARD MASK AND ARF LITHOGRAPHY

(75) Inventors: Marina V. Plat, San Jose, CA (US); Scott A. Bell, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 366 days.

(21) Appl. No.: 11/733,935

(22) Filed: Apr. 11, 2007

(65) Prior Publication Data
US 2008/0254607 A1    Oct. 16, 2008

(51) Int. Cl.
*H01L 29/788*    (2006.01)
(52) U.S. Cl. .................... 438/264; 257/E29.3
(58) Field of Classification Search ............. 438/257, 438/258, 593; 257/316, E21.422
See application file for complete search history.

(56) References Cited

U.S. PATENT DOCUMENTS 7,018,868 B1 * 3/2006 Yang et al. ............... 438/110
2006/0046484 A1 * 3/2006 Abatchev et al. ......... 438/689

* cited by examiner

*Primary Examiner*—W. David Coleman
*Assistant Examiner*—Daniel Shook
(74) *Attorney, Agent, or Firm*—Turocy & Watson, LLP

(57) ABSTRACT

Systems and methods are described that facilitate integrating ArF core patterning of floating gate structures in a flash memory device followed by KrF periphery gate patterning using a hard mask comprising a material such as amorphous carbon to facilitate core gate construction. The amorphous carbon hard mask can facilitate preparing such core gate structures while protecting periphery gate stacks such that the periphery stacks are ready for immediate KrF lithography upon completion of core gate formation without requiring additional resist deposition between core and periphery etches.

20 Claims, 14 Drawing Sheets

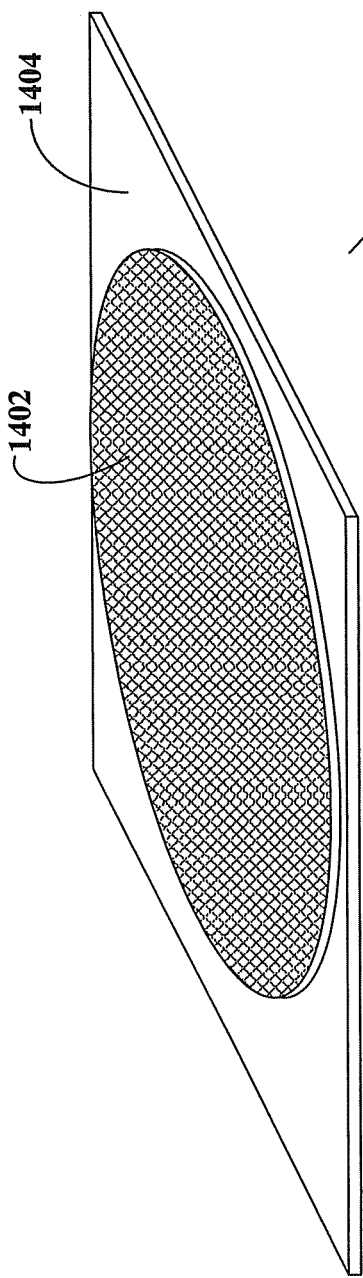
FIG. 14
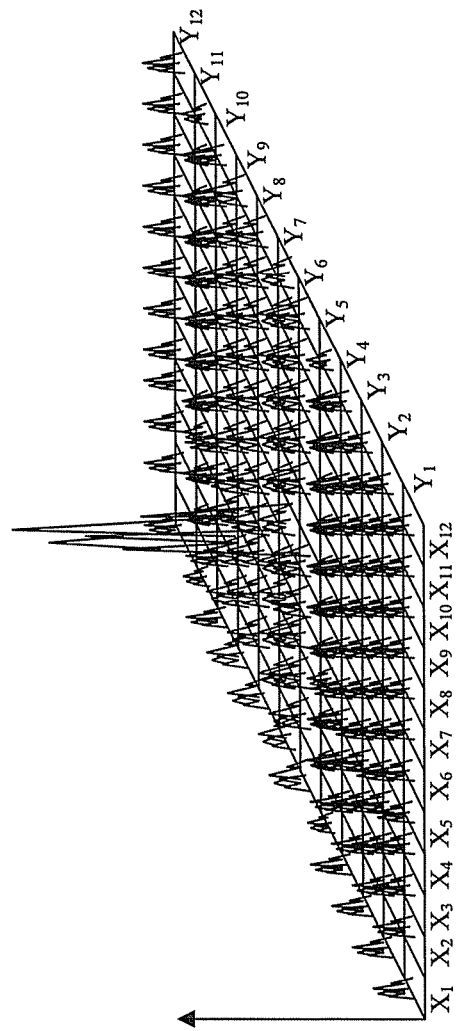
FIG. 16
FIG. 15

INTEGRATION APPROACH TO FORM THE CORE FLOATING GATE FOR FLASH MEMORY USING AN AMORPHOUS CARBON HARD MASK AND ARF LITHOGRAPHY

TECHNICAL FIELD

The present invention relates generally to semiconductor fabrication, and more particularly to systems and methodologies that facilitate integrating technologies for core and periphery gate patterning to construct core floating gate structures in flash memory while reducing fabrication costs and improving throughput.

BACKGROUND

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to a transfer of patterns onto a thin film that has been deposited onto a substrate. The transferred patterns then act as a blueprint for desired circuit components. Typically, various patterns are transferred to a photoresist (e.g., radiation-sensitive film), which overlies the thin film on the substrate during an imaging process described as "exposure" of the photoresist layer. During exposure, the photoresist is subjected to an illumination source (e.g., UV-light, electron beam, X-ray), which passes through a pattern template, or reticle, to print the desired pattern in the photoresist. Upon exposure to the illumination source, radiation-sensitive qualities of the photoresist permits a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Furthermore, throughput considerations and design rules have resulted in an industry-wide desire for systems and/or methodologies that facilitate reducing costs and increasing output without sacrificing quality. Thus, a need exists in the art for systems and/or methodologies that overcome the afore-mentioned deficiencies.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The subject invention provides for systems and methodologies that facilitate argon fluoride (ArF) patterning of a core region of one or more devices on a wafer followed by krypton fluoride (KrF) patterning of a periphery region the one or more devices on the wafer without damaging an extant anti-reflective coating (ARC) on the periphery and without requiring additional periphery ARC deposition between core and periphery patterning procedures.

According to an aspect of the invention, initial core and periphery stacks can be formed on a wafer and/or on a plurality of sub-regions of the wafer. In descending order, the periphery stack can comprise a silicon nitride (SiN) ARC that is tuned for KrF lithography, a poly layer (e.g., polysilicon and the like) and a gate oxide. The core stack can comprise, in descending order, a SiN ARC tuned for KrF lithography, a poly layer (e.g., such as the poly layer comprised by the periphery stack), an oxide-nitride-oxide (ONO) layer, another poly layer, and a tunnel oxide.

According to a related example, the initial core and periphery stacks described above can be augmented and etched to facilitate constructing multi-level core gate structures and immediately following such construction with etching of the periphery region of the wafer. For instance, and amorphous carbon hard mask can be deposited over the entire device and/or wafer (e.g., both the core and periphery regions), and a dielectric cap can be formed over the carbon hard mask. An ArF photoresist can be deposited over the entire wafer (core and periphery stacks alike) and can be exposed and developed in the core region(s) only, leaving the periphery region(s) unexposed. The cap and carbon layers can then be etched, which results in the ArF resist layer being stripped in-situ. Etch procedures can then be performed on the remaining layers of the core region, while the dielectric cap and a portion of the amorphous carbon layer are covering the periphery region protecting the periphery from being etched. After all ArF etc is complete the remaining A-carbon layer by $O_2$ plasma ash. This $O_2$ plasma technique can be employed to remove any remaining amorphous carbon, leaving the periphery region ready for KrF lithography and etch. This is achieved by applying the KrF resist on the entire substrate and exposing the periphery portion on the KrF stepper, while the core region is protected by unexposed resist. Thus, the systems and methodologies described herein can efficiently facilitate more cost-effective and rapid construction of core floating gates for flash memory devices than can be achieved using conventional systems and/or methods.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 14 illustrates a perspective view of a grid-mapped wafer that facilitates delimiting core and/or periphery boundaries flash memory devices and sub-regions thereof according to one or more aspects of the present invention.

FIG. 15 illustrates plots of measurements taken at grid-mapped locations on a wafer in accordance with one or more aspects of the present invention.

FIG. 16 illustrates a table containing entries corresponding to measurements taken at respective grid-mapped locations on a wafer in accordance with one or more aspects of the present invention.

DETAILED DESCRIPTION

Figure 1:
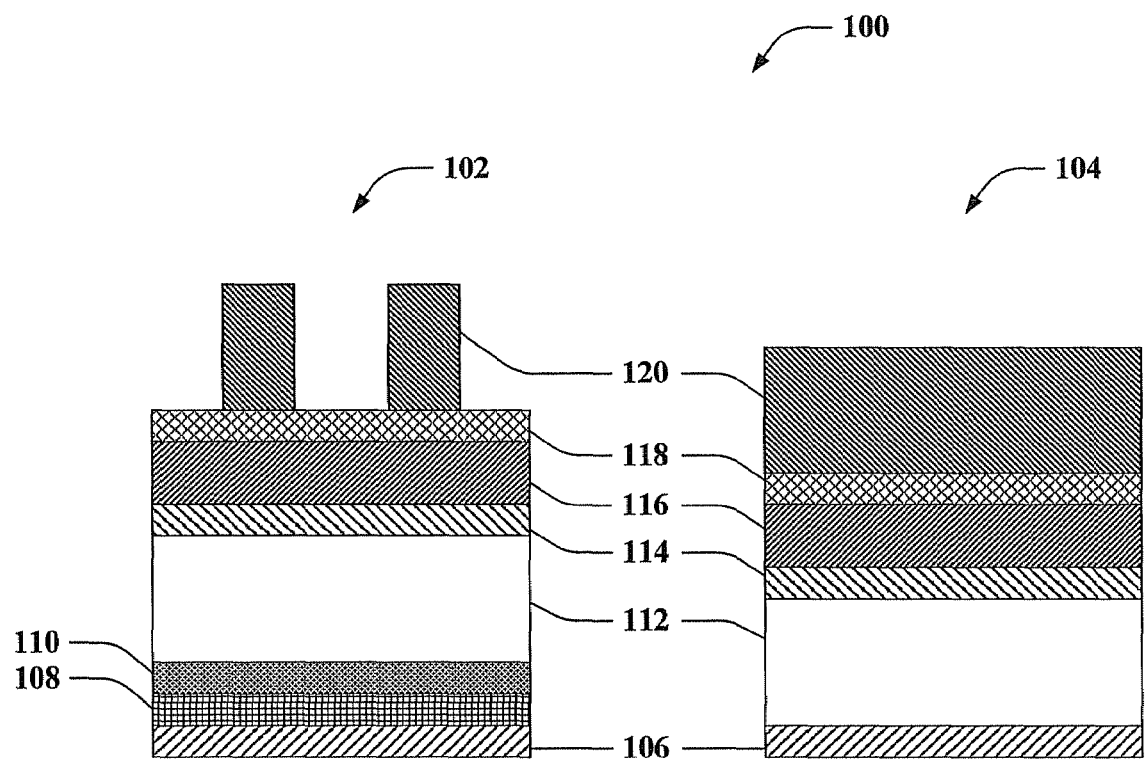
FIG. 1 is a cross-sectional illustration of core and periphery regions of a flash memory structure after core ArF lithography has been performed, in accordance with an aspect of the subject invention.

The present invention will now be described with reference to the drawings, wherein like reference numerals are used to refer to like elements throughout. The present invention will be described with reference to systems and methods for integrating ArF core patterning and subsequent KrF periphery patterning of devices on a wafer without damaging an extant periphery ARC and without requiring additional periphery ARC deposition between etch procedures. The subject systems and methods facilitate forming core floating gates for flash memory using an amorphous carbon hard mask in conjunction with an ArF patterning technique. It should be understood that the description of these exemplary aspects are illustrative in nature and that they should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is a cross-sectional illustration of core and periphery regions of a flash memory structure 100 after core ArF lithography has been performed, in accordance with an aspect of the subject invention. A plurality of the structures 100 can be formed on a wafer. The structure 100 comprises a core region 102 and a periphery region 104, which have similarly stacked layers. An oxide 106 can be deposited on a wafer substrate (not shown) in both of the core and periphery regions of the structure 100. For example, the oxide layer 106 can be a gate oxide in the periphery region 104 and can be a tunnel oxide in the core region 102. A first poly layer 108 (e.g., polysilicon, . . . ) can be deposited over the gate oxide 106 in the core region 102, followed by an oxide-nitride-oxide (ONO) layer 110, also deposited only in the core region 102 of the structure 100. A second poly layer 112 (e.g., polysilicon, . . . ) can then be formed over the entirety of the wafer, including both the core region 102 and the periphery region 104. A SiN ARC layer 114 can be deposited over the entire structure 100 and/or wafer on which the structure is formed, and can be tuned for KrF lithography.

An hard mask layer 116 (e.g., amorphous carbon layer, . . . ) can be deposited over the entire wafer at a thickness in the range from about 500 to about 1500 Angstroms, and/or can be approximately 1000 Angstroms. A dielectric cap 118 can be formed over the hard mask layer 116, and can comprise, for example, tetraethyl-ortho-silicate (TEOS), silicon-oxynitride (SiON), silicon-oxycarbide, and/or any other suitable dielectric cap material as will be appreciated by one skilled in the art. The dielectric cap layer can have a thickness in the range from, for example, about 100 to about 400 Angstroms. Additionally and/or alternatively, the thickness of the dielectric cap can range from approximately 200 to about 300 Angstroms. Finally, an ArF photoresist 120 can be deposited over the dielectric cap layer. The ArF photoresist layer 120 can have a thickness in the range from, for instance, about 150 to about 300 nanometers, from about 200 to about 250 nanometers, etc. The ArF resist layer 120 can be exposed and developed in the core region 102 only, such that the periphery region 104 is not exposed. In this manner, when an ArF lithography technique is performed on the wafer 102, the core region 102 will be etched while the periphery region 104 remains protected, as depicted by the illustration of FIG. 1. The illustrated stacks of photoresist 120 that remain in the core region 102 of the wafer 100 delineate semiconductor features, such as can be effected via employing a reticle during exposure of the resist layer 120 in the core region 102 of the structure 100.

Figure 2:
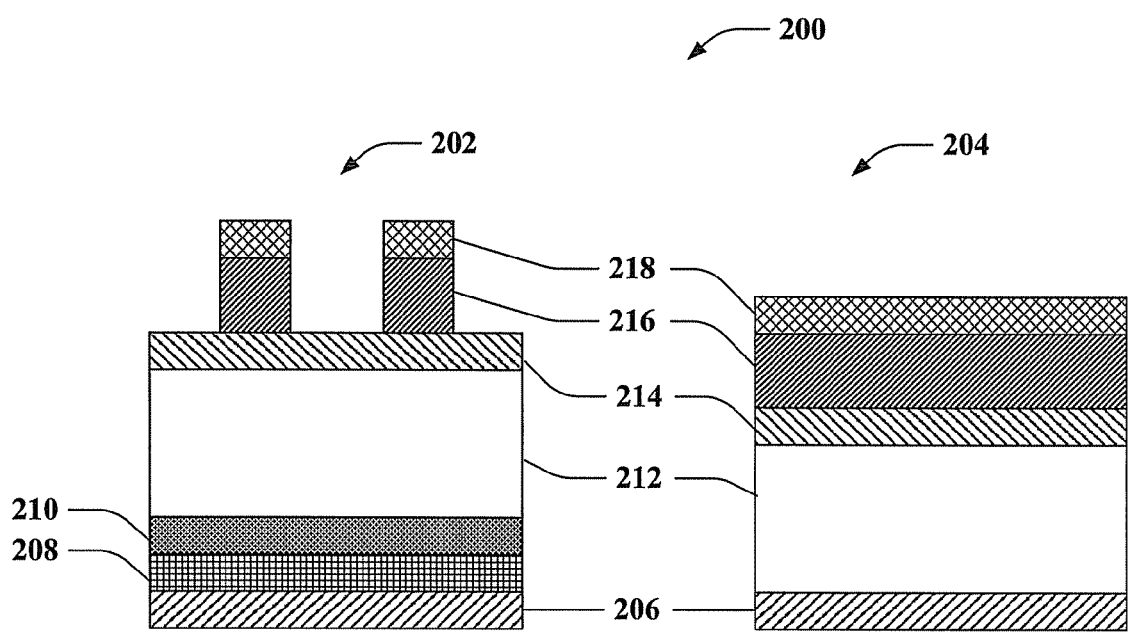
FIG. 2 is a cross-sectional illustration of core and periphery regions of a flash memory structure after etching of a dielectric cap and amorphous carbon layer, in accordance with an aspect of the subject invention.

FIG. 2 is a cross-sectional illustration of core and periphery regions of a flash memory structure 200 after etching of a dielectric cap and amorphous carbon layer, in accordance with an aspect of the subject invention. The structure 200 comprises a core region 202 and a periphery region 204. The core region 202 comprises an oxide layer (e.g., a tunnel oxide) 206 beneath a polysilicon layer 208 and an ONO layer 210. A second polysilicon layer 212 is formed over the ONO layer 210, and a SiN ARC layer 214 is deposited over the second polysilicon layer 212. Upon the SiN ARC layer 214 in the core region 202 are illustrated etched amorphous carbon stacks 216 having dielectric caps 218 thereon, as described with respect to FIG. 1. The etched features can be formed during an etch of the carbon and dielectric layers 216 and 218, whereby exposed portions of the layers are removed while layer portions where the ArF photoresist was retained are protected and are not etched. The ArF photoresist illustrated in FIG. 1 is stripped in-situ during the amorphous carbon etch procedure.

The periphery region 204 of the structure 200 comprises an oxide layer 206 (e.g., a gate oxide) having formed thereon a polysilicon layer 212. A SiN ARC layer 214 is deposited over the polysilicon layer 212 and can be tuned for KrF lithography. An amorphous carbon layer 216 and a dielectric cap layer 218 are deposited over the SiN ARC layer 214. As illustrated, the carbon layer 216 and dielectric layer 218 are not etched in the periphery region 204 because they were protected during the core etch by the ArF resist layer described with regard to FIG. 1. The resist layer of FIG. 1 is stripped in-situ during the amorphous carbon etch procedure, leaving the periphery protected by residual amorphous carbon layer protecting a dielectric cap.

Figure 3:
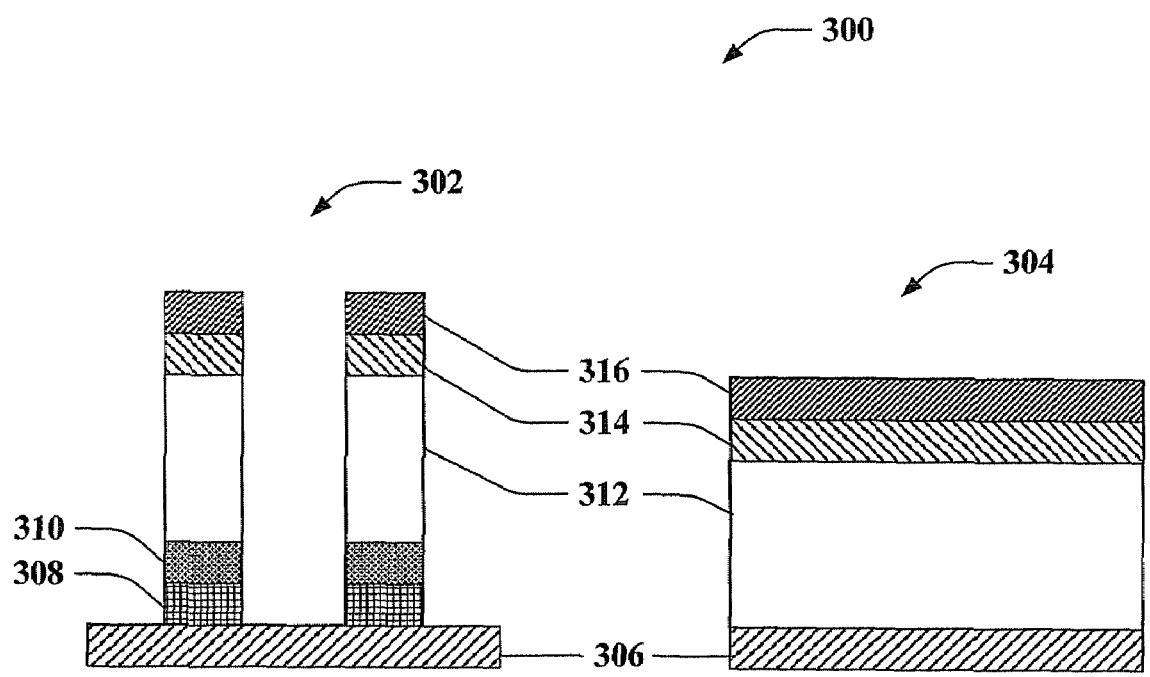
FIG. 3 is a cross-sectional illustration of core and periphery regions of a flash memory structure that has undergone a series of etch procedures of various stack layers, in accordance with an aspect of the subject invention.

FIG. 3 is a cross-sectional illustration of core and periphery regions of a flash memory structure 300 that has undergone a series of etch procedures of various stack layers, in accordance with an aspect of the subject invention. The structure 300 comprises a core region 302 and a periphery region 304. The core region 302 of the structure 300 is illustrated with two stacks of layers that have been etched. The stacks reside on an oxide layer 306, such as a tunnel oxide, and comprise a first polysilicon layer 308, an ONO layer 310, a second polysilicon layer 312, a SiN ARC layer 314 tuned for KrF lithography, and an amorphous carbon layer 316, respectively, in ascending order. The structure 300 has undergone etch procedures of the SiN ARC layer 314, the second polysilicon layer 312, the ONO layer 310, and the first polysilicon layer 308. Such layers are removed from portions of the wafer 300 where they were not protected by the amorphous carbon layer 316 and dielectric cap (not shown). The dielectric cap described with regard to FIGS. 1 and 2 is removed in-situ during the etch procedures, as is a portion of the amorphous carbon layer 316, although some of the amorphous carbon layer 316 can remain.

A periphery region 304 of the wafer comprises an oxide layer 306, such as a gate oxide, with a polysilicon layer 312 formed thereon. A SiN ARC layer 314 tuned for KrF lithography is formed over the polysilicon layer 312, and an amorphous carbon layer 316 is illustrated as having been deposited over the SiN ARC layer 314. The carbon layer 316 comprises remnants of the carbon layer 216 described with regard to FIG. 2, as a substantial portion of the layer was stripped in-situ during the etch procedures described above, along with the dielectric cap layer 214. In this manner, the layers 306, 312, and 314 remain protected in the periphery region 304 of the structure 300, while the etch procedures can be performed over the entire structure 300 and/or a wafer containing a plurality of such structures 300 without regard to core and periphery region boundaries.

Figure 4:
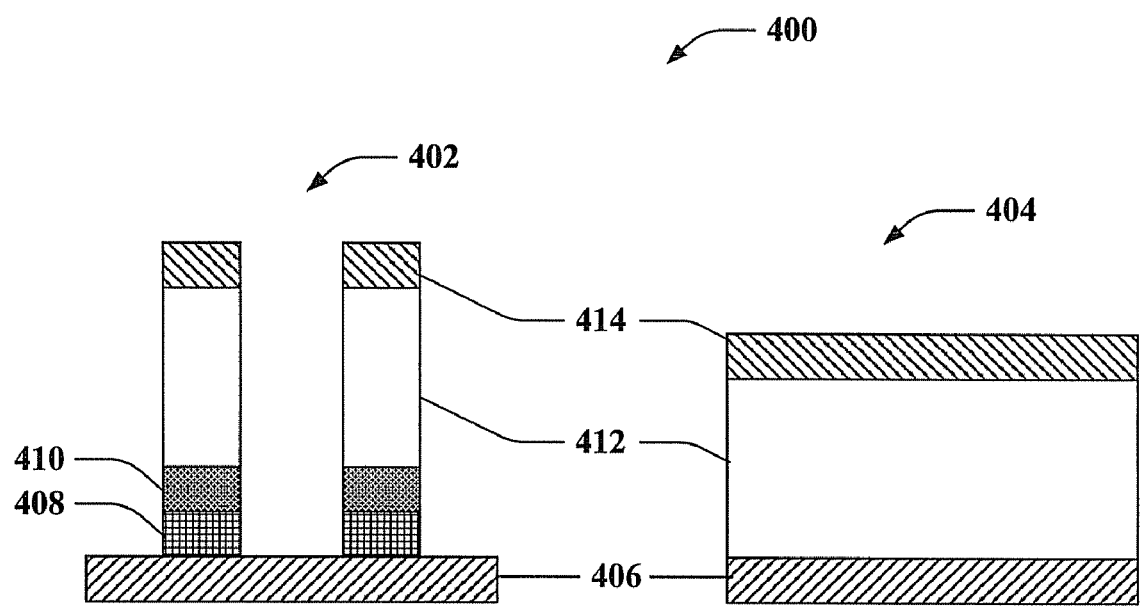
FIG. 4 is a cross-sectional illustration of core and periphery regions of a flash memory structure after an $O_2$ plasma ash procedure has been performed thereon, in accordance with an aspect of the subject invention.

FIG. 4 is a cross-sectional illustration of core and periphery regions of a flash memory structure 400 after an $O_2$ plasma ash procedure has been performed thereon, in accordance with an aspect of the subject invention. The structure 400 comprises a core region 402 and a periphery region 404. The $O_2$ plasma ash technique is performed over both the core region 402 and the periphery region 404 of the structure 400 to remove any remaining amorphous carbon such as is described above with regard to FIG. 3. Thus, the core region 402 of the structure 400 comprises a plurality of structures, each of which comprises an oxide layer 406 such as a tunnel oxide, a first polysilicon layer 408, an ONO layer 410, a second polysilicon layer 412, and a SiN ARC layer 414 tuned for KrF lithography in ascending order. Meanwhile, the periphery region comprises an oxide layer 406 such as a gate oxide, a polysilicon layer 412, and a SiN ARC layer 414 that is tuned for KrF lithography. Thus, the periphery region is ready for application of a KrF lithography technique and/or etch procedure, while structures in the core region 402 remain protected by KrF photoresist and the SiN ARC layer 414 thereon has not been exposed. In this manner, the subject systems and methodologies mitigate a need for application of an ARC spin-on between patterning of the core region 402 and the periphery region 404.

Figure 5:
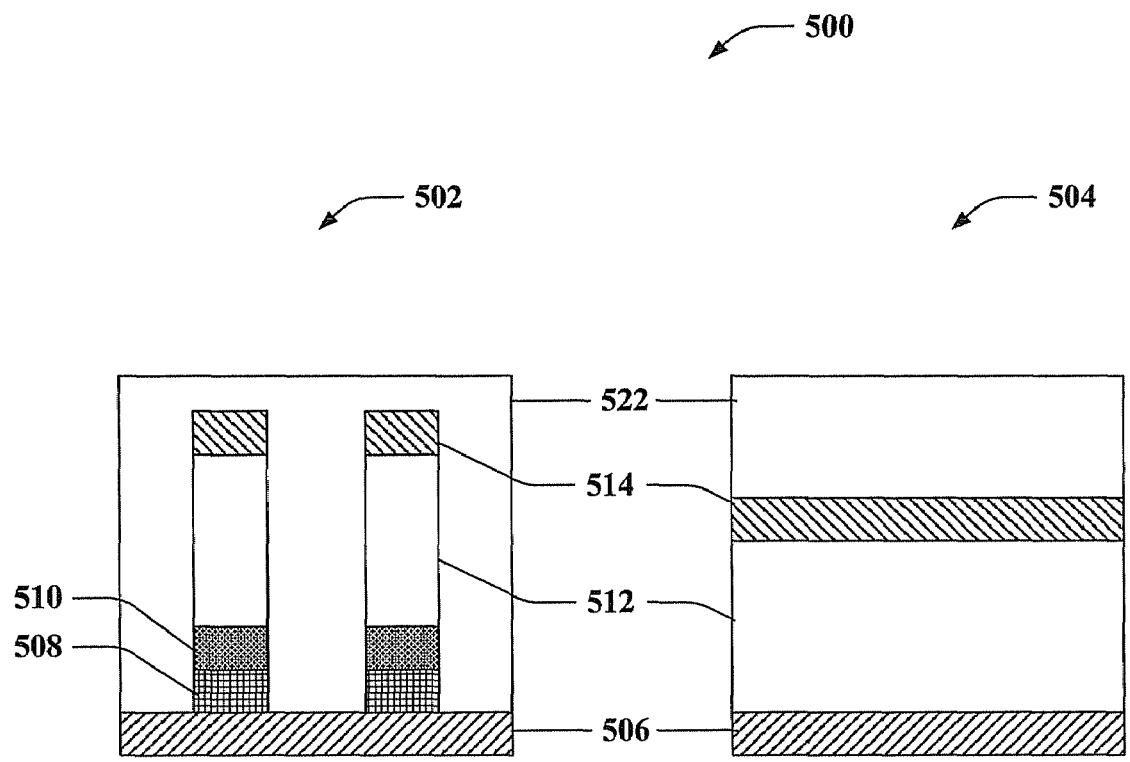
FIG. 5 is a cross-sectional illustration of core and periphery regions of a flash memory structure after deposition of a KrF resist layer, in accordance with one or more aspects.

FIG. 5 is a cross-sectional illustration of core and periphery regions of a flash memory structure 500 after deposition of a KrF resist layer, in accordance with one or more aspects. The structure 500 comprises a core region 502 and a periphery region 504, which in turn comprise various respective layers. For example, the core and region 502 comprises an oxide layer 506 such as a tunnel oxide, a first polysilicon layer 508, an ONO layer 510, a second polysilicon layer 512, a SiN ARC layer 514 tuned for KrF lithography, and a spin on ARC and a KrF resist layer 522 in ascending order. Meanwhile, the periphery region 504 comprises an oxide layer 506 such as a gate oxide, a polysilicon layer 512, a SiN ARC layer 514 that is tuned for KrF lithography, and a KrF resist layer 522. Structures in the core region 502 remain protected by KrF resist and the SiN ARC layer 514 thereon has not been exposed. In this manner, the subject systems and methodologies mitigate a need for application of an ARC spin-on between patterning of the core region 502 and the periphery region 504.

Figure 6:
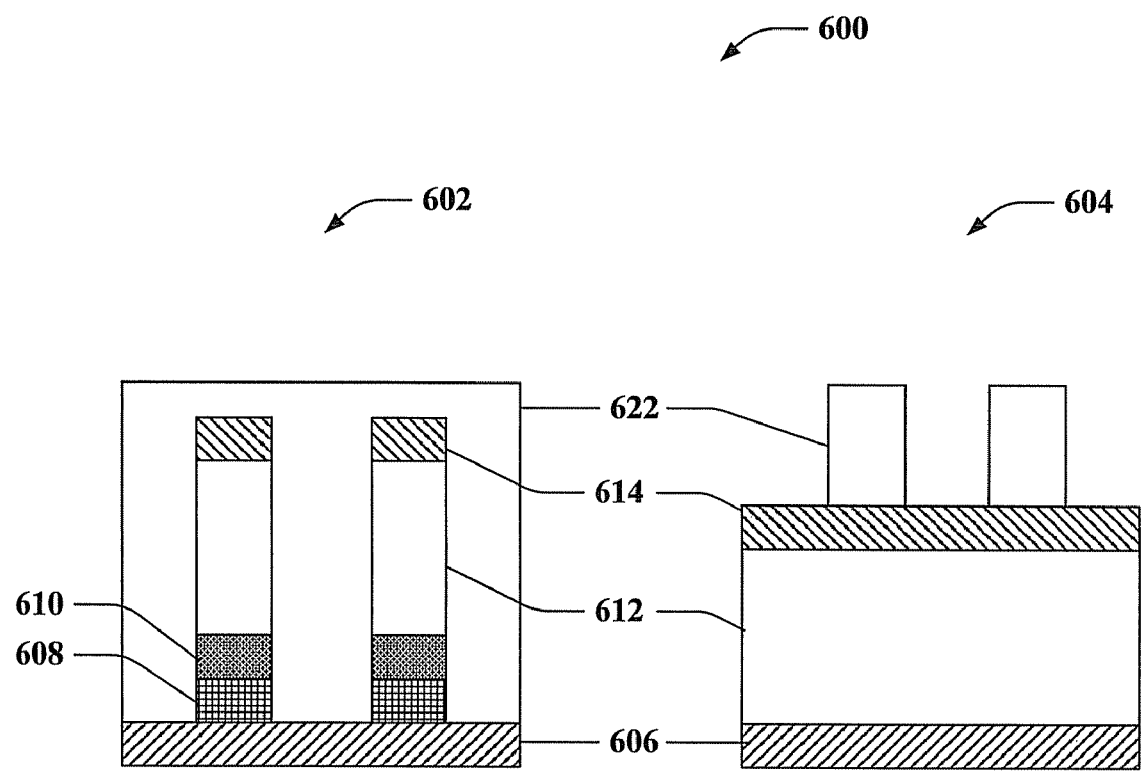
FIG. 6 is a cross-sectional illustration of core and periphery regions of a flash memory structure after exposing and etching a KrF resist layer in a periphery region of the structure, in accordance with one or more aspects.

FIG. 6 is a cross-sectional illustration of core and periphery regions of a flash memory structure 600 after exposing and etching a KrF resist layer in a periphery region of the structure 600, in accordance with one or more aspects. The structure 600 comprises a core region 602 and a periphery region 604, which in turn comprise various respective layers. The core and region 602 can comprise an oxide layer 606 such as a tunnel oxide, a first polysilicon layer 608, an ONO layer 610, a second polysilicon layer 612, a SiN ARC layer 614 tuned for KrF lithography, and a KrF resist layer 622, in ascending order. The periphery region 604 can comprise an oxide layer 606 such as a gate oxide, a polysilicon layer 612, a SiN ARC layer 614 tuned for KrF lithography, and a KrF resist layer 622. Structures in the core region 602 are still protected because the SiN ARC layer 614 thereon has not been exposed, while KrF resist layer 622 has been etched in the periphery region to form desired structures.

Figure 7:
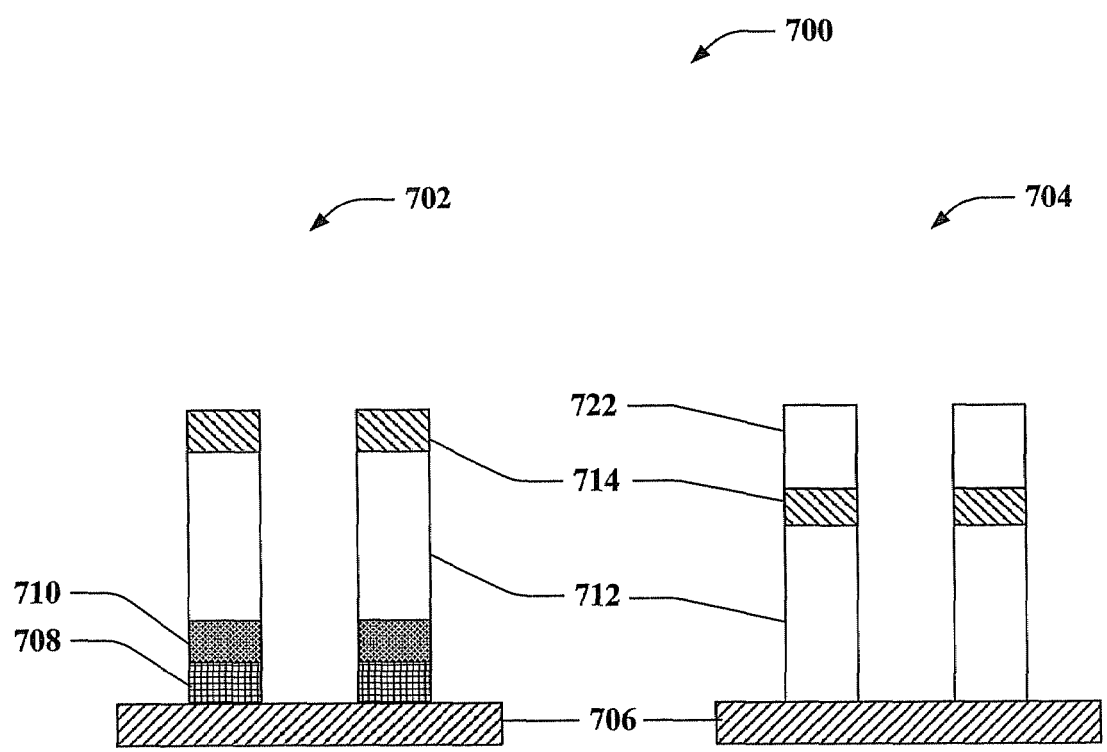
FIG. 7 is a cross-sectional illustration of core and periphery regions of a flash memory structure after removing the remaining unexposed KrF resist in the core region of the structure, in accordance with one or more aspects.

FIG. 7 is a cross-sectional illustration of core and periphery regions of a flash memory structure 700 after removing the remaining unexposed KrF resist in the core region of the structure 700, in accordance with one or more aspects. The structure 700 comprises a core region 702 and a periphery region 704, which in turn comprise various respective layers. The core and region 702 comprises an oxide layer 706 such as a tunnel oxide, a first polysilicon layer 708, an ONO layer 710, a second polysilicon layer 712, and an SiN ARC layer 714 tuned for KrF lithography, in ascending order, as described above with regard to FIGS. 5 and 6, but with the KrF resist layer removed. The periphery region 704 comprises an oxide layer 706 such as a gate oxide, a polysilicon layer 712, a SiN ARC layer 714 that is tuned for KrF lithography, and a KrF resist structure 722.

Figure 8:
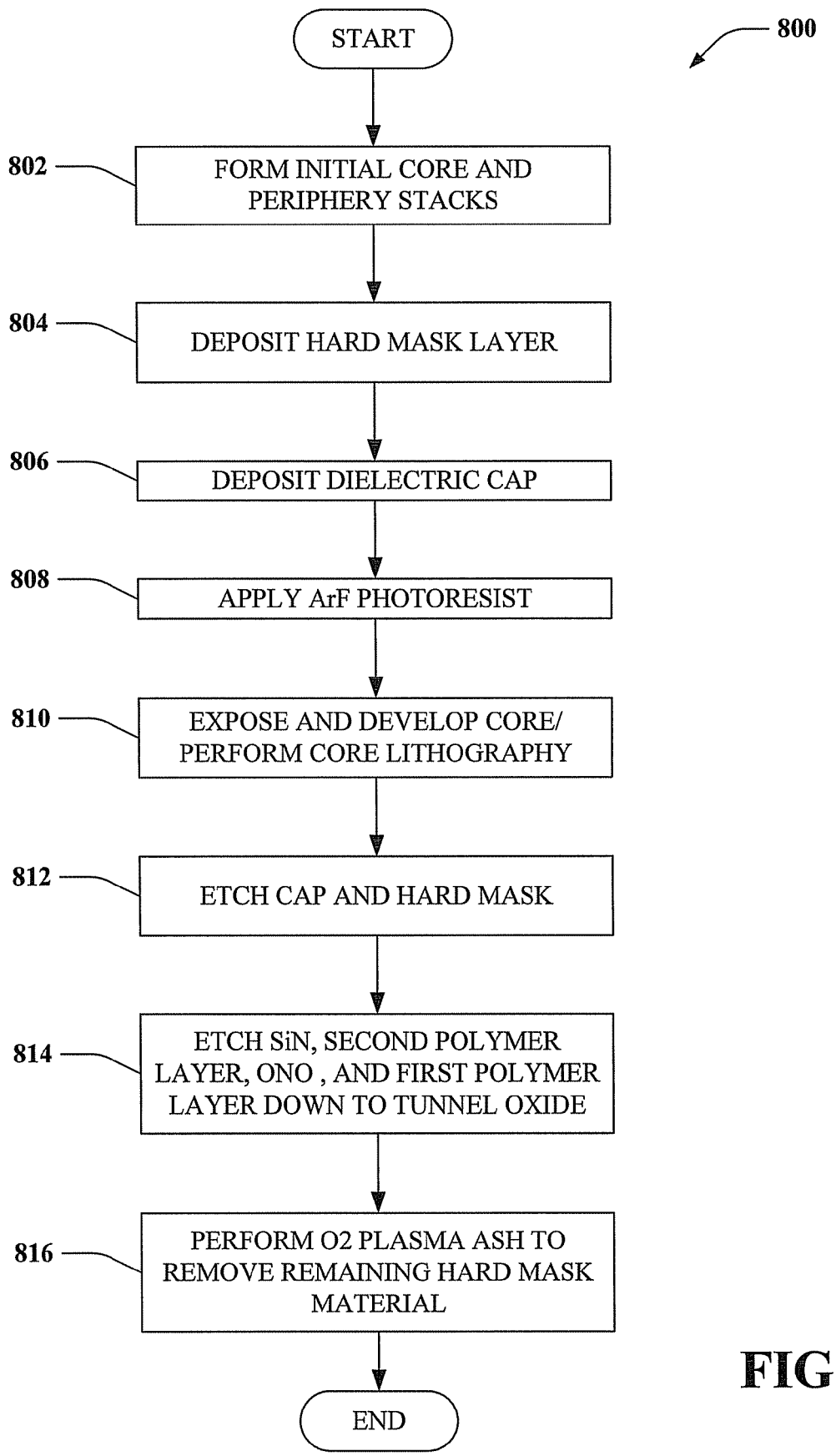
FIG. 8 is an illustration of a methodology for integrating ArF and KrF lithographic techniques for respectively etching core and periphery regions of a flash memory device without requiring additional periphery ARC spin-on between patterning actions and without damaging extant periphery ARC, in accordance with an aspect of the subject invention.
Figure 9:
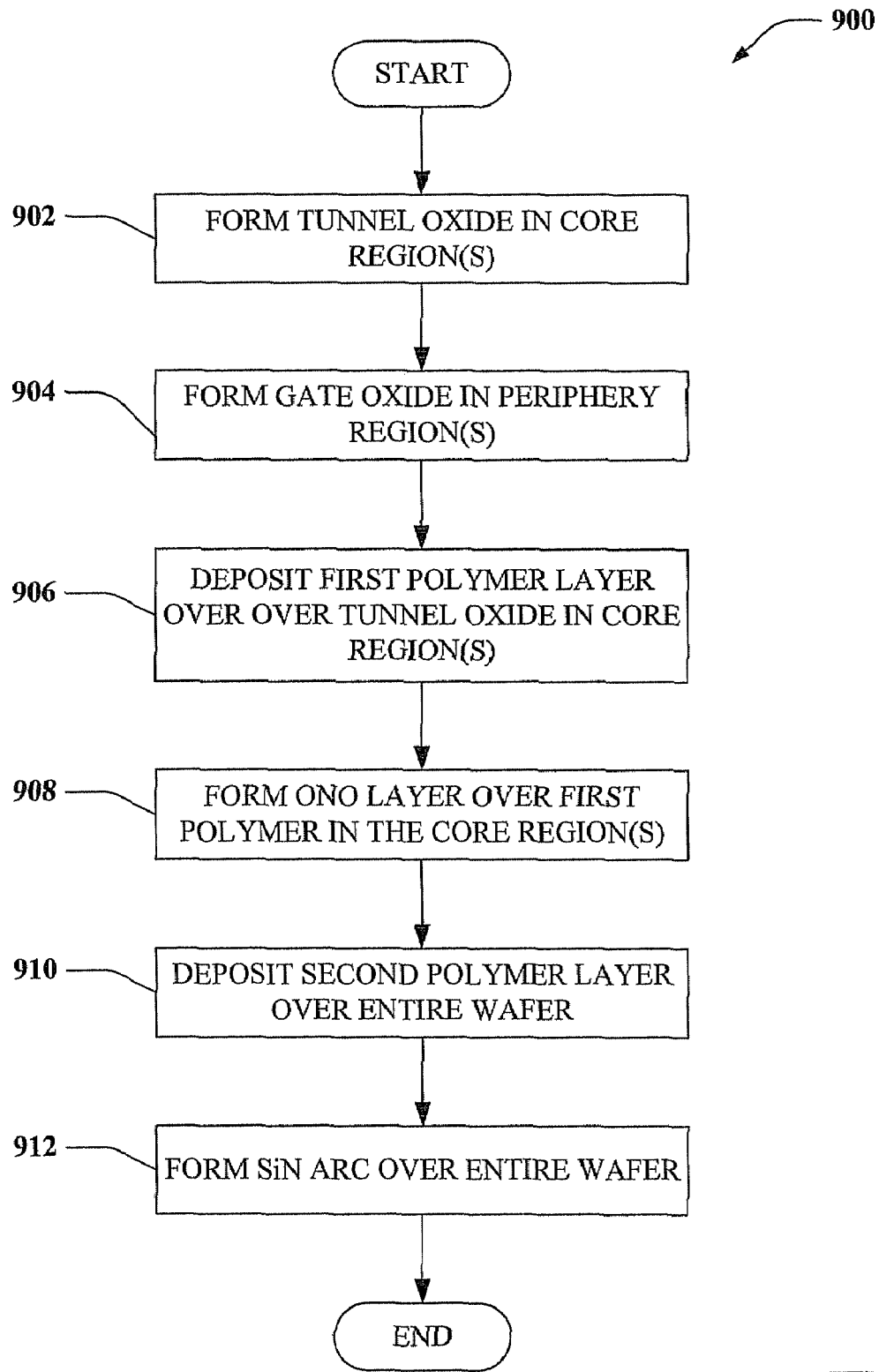
FIG. 9 is an illustration of a methodology for forming initial core and periphery stacks in a manner that facilitates protecting a periphery ARC layer and mitigating a need for supplemental ARC deposition between ArF core etch and KrF periphery etch procedures, in accordance with an aspect of the subject invention.

Turning briefly to FIGS. 8 and 9, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 8 is an illustration of a methodology 800 for integrating ArF and KrF lithographic techniques for respectively etching a core region and a periphery region of flash memory structures on a wafer without requiring additional periphery ARC spin-on between patterning actions and without damaging extant periphery ARC, in accordance with an aspect of the subject invention. According to the method, at 802, initial core and periphery stacks can be formed. Formation of the initial stacks is described in greater detail infra, with regard to FIG. 9. At 804, a hard mask layer (e.g., amorphous carbon layer, . . . ) can be deposited over the entire wafer (e.g., over both the core regions and the periphery regions). A dielectric cap layer can be formed over the hard mask layer at 806. The dielectric cap can comprise, for example, tetraethyl-orthosilicate (TEOS), silicon-oxynitride (SiON), silicon oxycarbide, and the like, as will be understood by one skilled in the art. At 808, an ArF photoresist can be deposited over the entire wafer. The core portion can be exposed and/or developed at 810, and ArF core lithography can be performed while the periphery region is left unexposed, which can result in a configuration such as is illustrated with regard to FIG. 5. At 812, an etch can be performed on the dielectric cap and hard mask layers, whereby the ArF resist layer is stripped in-situ, in order to achieve a configuration such as is depicted with regard to FIG. 6. The configuration of FIG. 3 can be achieved at 814 via performing etch process(es) on the SiN layer, the second polysilicon layer, the ONO layer, and the first polysilicon layer, respectively, such that core regions of the wafer are etched down to the tunnel oxide, which also results in in-situ removal of the dielectric cap layer and a portion of the hard mask layer in both core and periphery regions. At 816, an O₂ plasma ash procedure can be performed to remove any residual hard mask material (e.g., amorphous carbon), leaving the core protected by the SiN ARC and the periphery ready for KrF lithography.

FIG. 9 is an illustration of a methodology 900 for forming initial core and periphery gate stacks on a wafer in a manner that facilitates protecting a periphery ARC layer and mitigating a need for supplemental ARC deposition between ArF core etch and KrF periphery etch procedures, in accordance with an aspect of the subject invention. At 902, a tunnel oxide can be deposited in one or more core regions of a wafer substrate. At 904, a gate oxide can be deposited in one or more periphery regions of the wafer substrate. It is to be appreciated that acts 902 and 904 can be performed concurrently, depending on fabrication/design goals, efficiency requirements, and the like. A first poly layer (e.g., polysilicon, . . . ) can be deposited over the tunnel oxide in the core region at 906. At 908, an ONO layer can be formed over the first poly layer in the core region. A second poly layer, such as a polysilicon layer, can then be deposited over the entire wafer (e.g., core and periphery regions alike) at 910. Finally, a SiN ARC layer can be provided over the entire wafer at 912. In this manner, upon completion of the methodology 900, the periphery region is immediately ready for etching using the more cost-effective KrF lithographic process(es).

Figure 10:
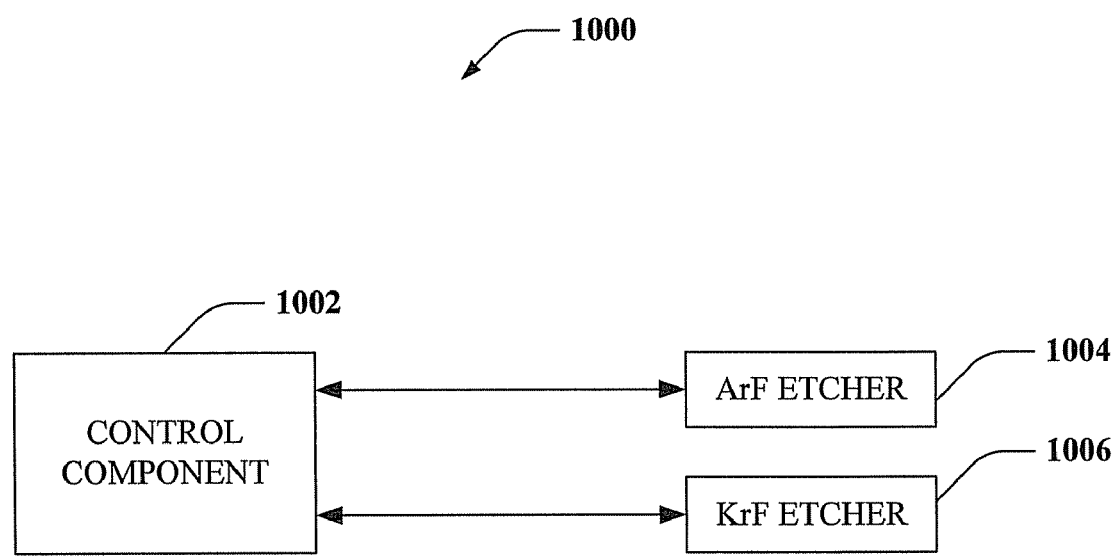
FIG. 10 is an illustration of a system that facilitates sequential argon fluoride (ArF) core region patterning and krypton fluoride (KrF) peripheral region patterning of respective portions of flash memory structures on a wafer without intermediate resist deposition over the peripheral region, in accordance with an aspect of the subject invention.

FIG. 10 is an illustration of a system 1000 that facilitates sequential argon fluoride (ArF) core region patterning and krypton fluoride (KrF) peripheral region patterning of respective portions of flash memory structures on a wafer without intermediate resist deposition over the peripheral region, in accordance with an aspect of the subject invention. It is to be appreciated that the phrase "core region" as used herein can refer to a core region of a flash memory structure and/or to a core region of a wafer that comprises a plurality of core regions, each of which is related to a single flash memory structure located on the wafer. Similarly, the phrase "periphery region" can refer to a periphery region of an individual flash memory structure and/or to one or more periphery regions on a wafer comprising a plurality of such flash memory structures.

The system 1000 comprises a control component 1002 that is operatively coupled to each of an ArF etcher 1004 and a KrF etcher 1006. The control component 1002 facilitates controlling etch parameters, such as etch duration, etch depth, and the like, at different etch stages. The etch components 1004 and 1006 can be employed to etch both peripheral and core portions of a wafer without damaging a periphery antireflective coating (ARC) and without requiring additional periphery ARC spin-on between patterning actions. Moreover, it is to be appreciated that the system 1000 can comprise other etch components, such as a poly etcher, a low-k dielectric constant asher component, a metal etcher, and/or any other etching component(s) suitable to etch the structures described herein, as will be understood by one skilled in the art.

Core and periphery gates in floating gate technologies often have different density, structural, and performance requirements. Film stacks for the two types of gates differ, and therefore conventional systems require separate mask and etch processes, increasing fabrication costs and reducing wafer throughput. For instance, a traditional approach can include masking and etching a core region while a periphery region is protected by a photoresist, and then stripping the photoresist from the wafer; applying a separate photoresist protective coating to the etched core region of the gate and subsequently masking and etching the periphery region; and finally stripping the photoresist from the wafer a second time. Such conventional methods require repeated photoresist applications that can increase fabrication time and decrease profit margins.

At the 65 nm node in lithography, a minimum pitch of a core gate structure can be, for example, approximately 200 nm or less. As such, ArF lithographic technology becomes desirable to achieve such miniscule features. However, periphery gates typically have more relaxed design rules, such that minimum pitch dimensions can be approximately 400 nm. At such critical dimensions, KrF lithographic techniques can be desirable due to cost-effectiveness considerations when compared with ArF techniques. Due to the relatively lower etch resistance of modern ArF photoresists, thickness of such resist layers can be limited by aspect ratio considerations. Accordingly, a hard mask can be employed to facilitate successfully etching through a multi-layer core gate structure. Additionally, the hard mask can be designed to exhibit antireflective properties consistent with ArF lithographic requirements. By default, such a resist layer is deposited over both the core and periphery regions of a wafer. The subject invention provides for a hard mask/ARC film that meets such criteria while leaving the periphery region ready for KrF lithography upon removal of the mask. Additionally, the subject invention mitigates damage to a periphery ARC during core etching as well as a need for an additional ARC deposit over the periphery between core and periphery etches.

For example, a silicon nitride (SiN) ARC layer can be deposited over both core regions of a wafer and periphery regions thereof. Thus, when the system 1000 acts upon the wafer to etch core and periphery regions thereof, the periphery region will be ready for etching upon completion of the core region etch procedures without requiring additional resist deposition. Detailed methodologies for constructing core and periphery stacks and for etching such stacks are presented supra with regard to FIGS. 1-9.

Figure 11:
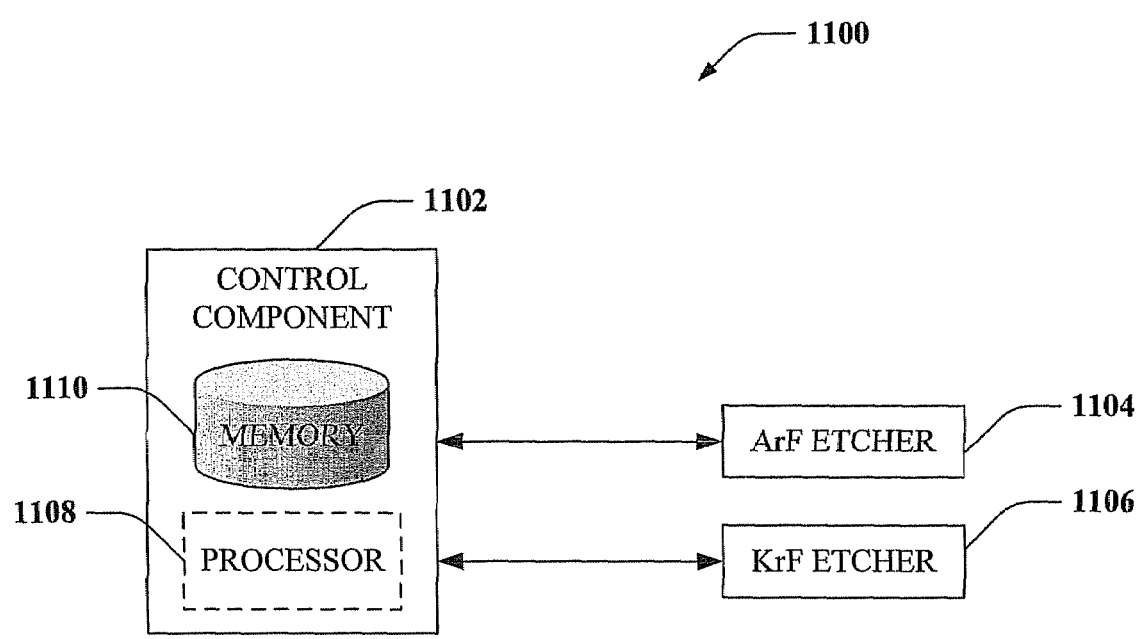
FIG. 11 is an illustration of a system that facilitates forming gate structures in both core and periphery regions on a wafer via etching a core region with an ArF etch process and immediately following the core etch with a KrF etch process on a periphery region, in accordance with an aspect of the subject invention.

FIG. 11 is an illustration of a system 1100 that facilitates forming gate structures in both core and periphery regions on a wafer via etching a core region with an ArF etch process and immediately following the core etch with a KrF etch process on a periphery region, in accordance with an aspect of the subject invention. The system comprises a control component 1102 that is operatively coupled to an ArF etcher 1104 and a KrF etcher 1106. The system 1100 can employ the ArF etcher 1104 to etch a core gate stack that has been prepared in a manner such that upon completion of the ArF etch of the core, a periphery gate stack is ready to be etched by the KrF etcher 1106. A detailed description of core and periphery gate stacks is presented supra, with respect to FIGS. 1-7. The control component 1102 can receive information from the etch components 1104 and 1106 regarding etch progress and can provide control functionality to the system 1100 to facilitate governance of etch parameters (e.g., etch duration, depth, . . . ). The control component 1102 is further associated with a processor 1108 and a memory 1110, each of which is further operatively coupled to the other.

It is to be understood that a that the processor 1108 can be a processor dedicated to evaluating information related to etching core and periphery regions on a wafer, a processor used to control one or more of the components of the system in which it is employed, or, alternatively, a processor that is both used to evaluating information related to etching core and periphery regions on a wafer and to control one or more of the components of the system in which it is employed.

The memory component 1110 can be employed to retain information associated with, for example, etch parameters, wafer orientation, wafer topography, core and periphery regions on a wafer and/or boundaries thereof, etc. Furthermore, the memory 1110 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the subject systems and methods is intended to comprise, without being limited to, these and any other suitable types of memory.

Figure 12:
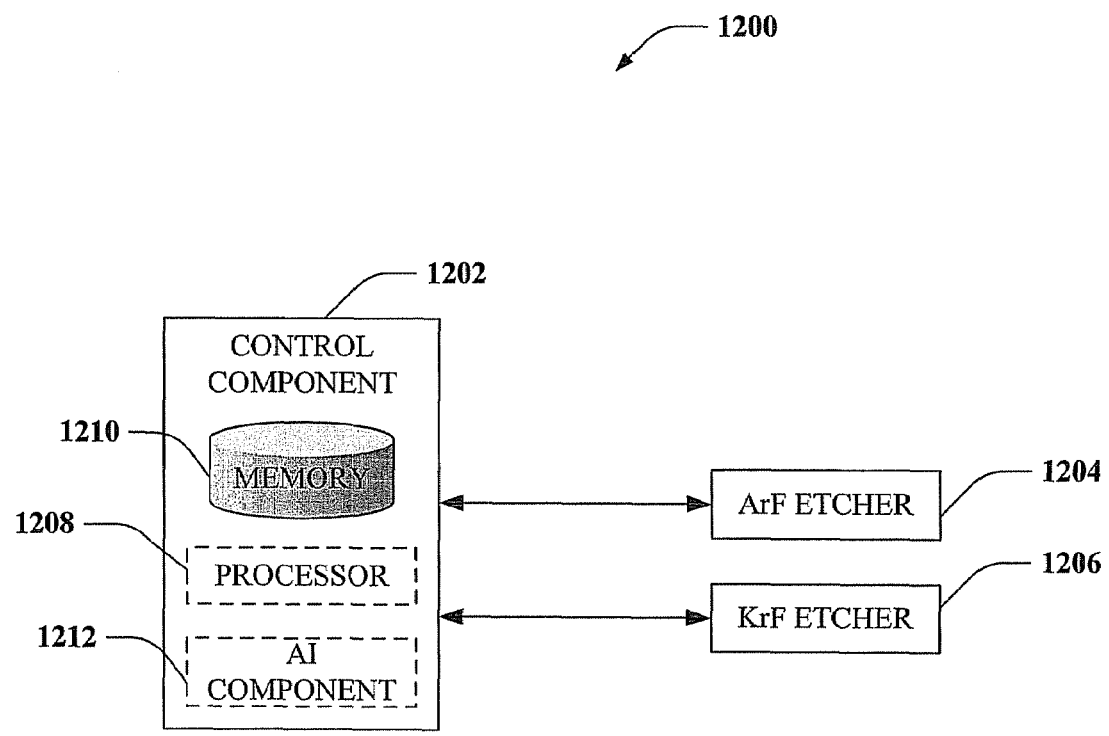
FIG. 12 is an illustration of a system that can make inferences regarding etching each of core and periphery gate structures on a wafer in successive etch processes without requiring additional resist deposition between etch processes, in accordance with an aspect of the subject invention.

FIG. 12 is an illustration of a system 1200 that can make inferences regarding etching each of core and periphery gate structures on a wafer in successive etch processes without requiring additional resist deposition between etch processes, in accordance with an aspect of the subject invention. The system 1200 can employ various inference schemes and/or techniques in connection with performing back-to-back etches of core and periphery regions. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 12, a system 1200 is illustrated that facilitates integrated core and periphery etches utilizing different etch processes while mitigating a need for an intermediate resist application between etches of the respective wafer regions. The system comprises a control component 1202 that is in bi-directional communication with an ArF etcher 1204 and a KrF etcher 1206. However, it is to be appreciated that the system 1200 can comprise any suitable etcher to perform an etch process on any one or more of the wafer layers described herein, as will be appreciated by one skilled in the art. Further associated with the control component 1202 are a processor 1208, a memory 1210, and an artificial intelligence (AI) component 1212 that can make inferences regarding etch quality and/or gate structure consistency. For example, that AI component 1212 can receive information related to etch parameters (e.g., etch duration, ambient temperature, beam intensity, . . . ) and based at least in part on such information can infer whether a particular wafer or portion thereof fails to meet a predefined minimum quality standard. Such a determination can facilitate a decision regarding whether to discard a wafer or a batch thereof based on cost-benefit analysis and the like.

According to another example, the AI component 1212 can make inferences related to whether an etch of a core region is complete and an etch of a periphery region can be initiated. For instance, such inferences can be facilitated via analysis of information related to a plasma ash procedure that removes residual amorphous carbon from the surfaces of the core and periphery regions of the wafer. If the inference indicates that the surfaces are sufficiently free of amorphous carbon, the AI component 1212 can feed forward a recommendation to the control component 1202 to initiate the KrF etch of the periphery region of the wafer. It is to be appreciated that the preceding examples are illustrative in nature and are not intended to limit the scope of the manner in which the AI component 1212 makes inferences or the number of inferences that can be made by the AI component 1212.

Figure 13:
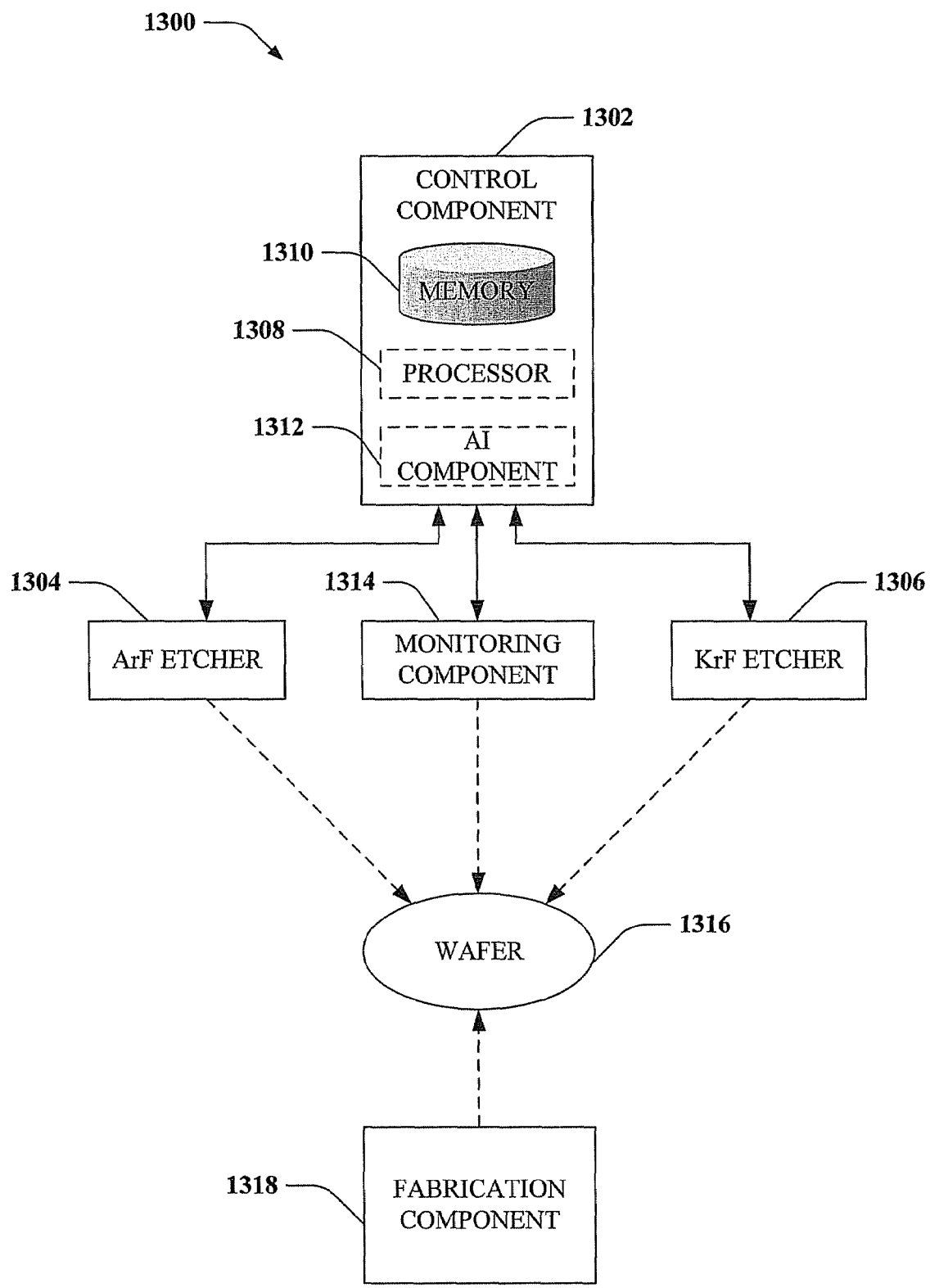
FIG. 13 is an illustration of a system that facilitates integrating ArF and Krf lithographic techniques for successively etching core and periphery regions of flash memory devices on a wafer, without an intermediate resist deposition, in accordance with an aspect of the invention.

FIG. 13 is an illustration of a system 1300 that facilitates integrating ArF and Krf lithographic techniques for successively etching core and periphery regions of flash memory devices on a wafer, without an intermediate resist deposition, in accordance with an aspect of the invention. A control component 1302 is operatively coupled to an ArF etcher 1304 for etching core regions of the wafer and a KrF etcher 1306 for etching periphery regions of the wafer. The control component 1302 further comprises a processor 1308, a memory component 1310, and an AI component 1312, as described with respect to the previous figures. Additionally, the system 1300 comprises a monitoring component 1314 and that gleans information related to a status of a wafer 1316 and/or gates formed thereon during and/or after fabrication by a fabrication component 1318. It is to be appreciated that the fabrication component 1318 can be operatively associated with the control component 1302 and/or in bi-directional communication therewith. Additionally, although the fabrication component 1318 is illustrated as a separate component from the etch components 1304 and 1306, the fabrication component 1318 can comprise the either or both of the ArF etcher 1304 and the KrF etcher 1306.

For example, the fabrication component 1318 can construct a wafer with both core and periphery regions using conventional systems and/or techniques. For instance, one suitable technique that can be utilized is a spin-on technique, which involves depositing a mixture of the material and a solvent, and then removing the solvent from the layer. Another suitable technique is chemical vapor deposition (CVD). CVD comprises low-pressure chemical vapor deposition (LPCVD), plasma enhanced chemical vapor deposition (PECVD), and high density chemical vapor deposition (HD-CVD).

To further this example, a tunnel oxide layer can be deposited over a core region on a wafer substrate, and a gate oxide can be deposited on a periphery region on the substrate. A first poly layer can be deposited over the tunnel oxide in the core region, followed by an ONO layer. A second poly layer can be deposited over both the core and periphery regions of the wafer. It is to be appreciated that the polymer layers to be described herein can comprise any suitable polymer material employed in the construction of core and/or peripheral gates, and such materials are known in the art. Finally, a silicon nitride (SiN) ARC layer can be formed over both the core and periphery regions of the wafer. The SiN ARC layer can be tuned for KrF lithography.

An amorphous carbon layer and a dielectric cap can be deposited over the ARC layer, and an ArF photoresist can be deposited over the dielectric cap. Finally, prior to etching, the ArF photoresist layer can be exposed and developed in the core region of a gate stack while resist in the periphery region is left unexposed. The unexposed resist can protect the periphery region during the ArF etch of the core region.

Once the fabrication component 1318 has constructed the core and periphery stacks on the wafer as detailed above, the etch components 1304 and 1306 can etch the dielectric cap and amorphous carbon layer, during which time the resist in a periphery region is stripped in-situ. The ArF etcher 1304 can further etch the remaining core layers down to the tunnel oxide. The dielectric cap and a portion of the carbon layer in the periphery can be removed in-situ during the SiN etch. Finally, the fabrication component 1318 can perform an $O_2$ plasma ash process on the wafer 1316 to remove any excess amorphous carbon from the core and periphery regions. Once the wafer 1316 is free of carbon residue, the periphery is ready to be etched by the KrF etcher 1306, and the core is protected by unexposed resist.

It is to be appreciated that the monitoring component 1314 can be, for example, a scatterometry component, without being limited thereto. The present invention contemplates any suitable scatterometry component and/or system, and such systems are intended to fall within the scope of the hereto-appended claims. It is further to be appreciated that the monitoring component 1314 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically in the range of 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 1316 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

Turning now to FIGS. 14-16, in accordance with one or more aspects of the present invention, a wafer 1402 (or one or more die located thereon) situated on a stage 1404 can be logically partitioned into grid blocks to facilitate delineating core and periphery regions, sub-regions thereof, and/or boundaries thereof, as well as to facilitate monitoring specific wafer portions as the wafer matriculates through a semiconductor fabrication process. This can facilitate selectively determining to what extent, if any, fabrication adjustments are necessary. Obtaining such information can also assist in determining problem areas associated with fabrication processes.

FIG. 14 illustrates a perspective view of the steppable stage 1404 supporting the wafer 1402. The wafer 1402 can be divided into a grid pattern as shown in FIG. 14. Each grid block (XY) of the grid pattern corresponds to a particular portion of the wafer 1402 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 15, one or more respective portions of the wafer 1402 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 1402 and or one or more die located thereon can be mapped into any suitable number and/or arrangement of grid blocks to effectuate desired monitoring and control.

FIG. 16 is a representative table of concurrently measured critical dimensions and overlay taken at various portions of the wafer 1402 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value (VA) (e.g., no overlay error is indicated and/or overlay measurements and critical dimensions are within acceptable tolerances), while grid block $X_7Y_6$ has an undesired value (Vu) (e.g., overlay and critical dimensions are not within acceptable tolerances, thus at least an overlay or CD error exists). Thus, it has been determined that an undesirable fabrication condition exists at the portion of the wafer 1402 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 1402 as desired. For example, when the fabrication process has reached a pre-determined threshold level (e.g., X % of grid blocks have acceptable CDs and no overlay error exists), a fabrication step can be terminated.

What is described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A method of forming floating gate structures in a flash memory device, comprising:
   depositing a hard mask layer over initial core stacks and periphery stacks;
   forming a dielectric cap over the hard mask layer;
   applying an argon fluoride photoresist over the dielectric cap;
   exposing and developing the argon fluoride photoresist in core regions in which the core stacks are located; and
   performing a series of etch procedures to etch the core stacks down to a tunnel oxide layer to form core floating gate structures while protecting the periphery stacks located in periphery regions.

2. A method for integrating lithography techniques for core and periphery portions of a memory device, comprising:
   forming an amorphous carbon hard mask and dielectric cap over core gate stacks and periphery gate stacks on a wafer;
   forming an argon fluoride photoresist over the dielectric cap;
   leaving the argon fluoride photoresist unexposed over the periphery gate stacks and portions of the core gate stacks where core gates are to be formed; and
   etching the core gate stacks down to a tunnel oxide layer at the base thereof to form the core gates while leaving the periphery gate stacks intact and ready for krypton fluoride lithography.

3. A system that facilitates forming core floating gate structures for flash memory, comprising:
   means for fabricating initial core stacks and periphery stacks on a wafer, the core stacks and periphery stacks comprise a silicon nitride antireflective coating that is tuned for krypton fluoride lithography;
   means for forming an amorphous carbon hard mask, a dielectric cap, and an argon fluoride photoresist, successively, over the core stacks and periphery stacks;
   means for exposing and developing the argon fluoride photoresist while leaving the resist unexposed over the periphery stacks;
   means for etching the core stacks to form core floating gate structures, whereby the photoresist, dielectric cap, and amorphous carbon hard mask layers over the periphery stacks are passively etched down to the silicon nitride antireflective layer; and
   means for removing residual amorphous carbon to prepare the periphery stacks for krypton fluoride lithography upon completion of etching of the core stack.

4. The method of claim 1, further comprising the act of forming the initial core stacks and periphery stacks via a series of acts comprising:
   depositing a tunnel oxide in one or more core regions on the wafer and a gate oxide in one or more of the periphery regions of the wafer;
   forming a first polysilicon layer over the tunnel oxide;
   depositing an oxide-nitride-oxide layer over the first polysilicon layer;
   forming a second polysilicon layer over the entire wafer; and
   depositing a silicon nitride antireflective coating over the entire wafer.

5. The method of claim 1, the dielectric cap comprises at least one of tetraethyl-ortho-silicate, silicon oxynitride, and silicon oxycarbide.

6. The method of claim 1, farther comprising leaving the argon fluoride photoresist unexposed in periphery regions.

7. The method of claim 1, the hard mask is an amorphous carbon hard mask.

8. The method of claim 1, the dielectric cap has a thickness from approximately 200 Angstroms to approximately 300 Angstroms.

9. The method of claim 1, the argon fluoride photoresist has a thickness from approximately 200 nanometers to approximately 250 nanometers.

10. The method of claim 2, the core gate stacks and periphery gate stacks comprise a layer of silicon nitride antireflective material that is tuned for krypton fluoride lithography and which remains on a top surface of formed core gates and the top surface of the periphery gate stacks to facilitate immediate transition to a krypton fluoride lithography procedure upon completion of core stack etching.

11. The method of claim 2, the dielectric cap comprises at least one of tetraethyl-ortho-silicate, silicon oxynitride, and silicon oxycarbide.

12. The system of claim 3, further comprising means for etching the periphery stacks.

13. The method of claim 4, further comprising tuning the silicon nitride antireflective coating for krypton fluoride lithography.

14. The method of claim 6, performing the series of etch procedures comprises performing an etch of the dielectric cap and hard mask layers whereby unprotected surfaces of layers in the core region are etched while unexposed argon fluoride photoresist in the core and periphery regions is removed in-situ.

15. The method of claim 7, farther comprising designing the amorphous carbon hard mask material to exhibit antireflective properties compatible with argon fluoride lithographic techniques.

16. The method of claim 7, the amorphous carbon hard mask has a thickness from approximately 500 Angstroms to approximately 1500 Angstroms.

17. The method of claim 14, farther comprising etching unprotected portions of a silicon nitride antireflective coating, a second polysilicon layer, an oxide-nitride-oxide layer, and a first polysilicon layer, respectively, in the core regions whereby unprotected surfaces of the dielectric cap and a portion of the hard mask layer in both the core and periphery regions are removed in-situ.

18. The method of claim 16, the amorphous carbon hard mask has a thickness of approximately 1000 Angstroms.

19. The method of claim 17, farther comprising applying a dioxide plasma ash technique to remove residual hard mask material from the core and periphery regions, leaving the periphery regions ready for krypton fluoride lithography and the core regions protected.

20. The method of claim 19, farther comprising employing a krypton fluoride lithographic technique to etch the periphery stacks to complete fabrication of the flash memory device.

* * * * *